(12) United States Patent
Nagai

(10) Patent No.: US 11,056,431 B2
(45) Date of Patent: Jul. 6, 2021

(54) ELECTRIC FUSE STRUCTURE AND METHOD FOR FABRICATING THE SAME

(71) Applicants: UNITED MICROELECTRONICS CORP., Hsin-Chu (TW); Fujian Jinhua Integrated Circuit Co., Ltd., Quanzhou (CN)

(72) Inventor: Yukihiro Nagai, Saijo (JP)

(73) Assignees: UNITED MICROELECTRONICS CORP., Hsin-Chu (TW); Fujian Jinhua Integrated Circuit Co., Ltd., Quanzhou (CN)

(*) Notice: Subject to any disclaimer, the term of this patent is extended or adjusted under 35 U.S.C. 154(b) by 0 days.

(21) Appl. No.: 15/275,479

(22) Filed: Sep. 26, 2016

(65) Prior Publication Data

US 2018/0019206 A1 Jan. 18, 2018

(30) Foreign Application Priority Data

Jul. 14, 2016 (CN) .......................... 201610554741.3

(51) Int. Cl.
*H01L 23/525* (2006.01)
*H01L 23/528* (2006.01)
*H01L 23/532* (2006.01)

(52) U.S. Cl.
CPC ...... *H01L 23/5256* (2013.01); *H01L 23/5283* (2013.01); *H01L 23/53228* (2013.01)

(58) Field of Classification Search
CPC ... H01L 23/525; H01L 23/62; H01L 23/5256; H01L 23/5252; H01L 23/5254; H01L 23/5283; H01L 23/53228
See application file for complete search history.

(56) References Cited

U.S. PATENT DOCUMENTS

| | | | |
|---|---|---|---|
| 4,089,734 A | 5/1978 | Bierig | |
| 5,844,296 A | 12/1998 | Murray et al. | |
| 6,501,107 B1* | 12/2002 | Sinclair | ................ B81B 3/0086 |
| | | | 257/208 |
| 6,586,985 B1* | 7/2003 | Romas, Jr. | .......... H01L 27/0802 |
| | | | 257/E23.149 |
| 8,102,019 B1 | 1/2012 | Tumakha et al. | |
| 8,598,679 B2 | 12/2013 | Cheng et al. | |
| 2008/0179707 A1 | 7/2008 | Ogawa | |
| 2008/0179708 A1 | 7/2008 | Ogawa | |
| 2009/0243113 A1 | 10/2009 | Tuten | |
| 2011/0292752 A1 | 12/2011 | Arai | |
| 2015/0022938 A1* | 1/2015 | Okada | ...................... H01G 4/33 |
| | | | 361/278 |

FOREIGN PATENT DOCUMENTS

CN 101140923 A 3/2008
CN 103930961 A 7/2014

\* cited by examiner

*Primary Examiner* — Sue A Purvis
*Assistant Examiner* — Scott Stowe
(74) *Attorney, Agent, or Firm* — Winston Hsu

(57) ABSTRACT

A method for fabricating semiconductor device is disclosed. First, a substrate is provided, and first fuse branches and second fuse branches are formed in the substrate, in which the first fuse branches and the second fuse branches are separated by a shallow trench isolation (STI) and the second fuse branches include different sizes. Next, fuse elements are formed to connect the first fuse branches and the second fuse branches.

7 Claims, 4 Drawing Sheets

US 11,056,431 B2

1

ELECTRIC FUSE STRUCTURE AND METHOD FOR FABRICATING THE SAME

BACKGROUND OF THE INVENTION

1. Field of the Invention

The invention relates to an electric fuse structure, and more particularly, to an electric fuse having fuse braches of different sizes.

2. Description of the Prior Art

As semiconductor processes become smaller and more complex, semiconductor components are influenced by impurities more easily. If a single metal link, a diode, or a MOS is broken down, the whole chip will be unusable. To treat this problem, fuses can be selectively blown for increasing the yield of IC manufacturing.

In general, fused circuits are redundant circuits of an IC. When defects are found in the circuit, fuses can be selectively blown for repairing or replacing defective circuits. In addition, fuses provide the function of programming circuits for various customized functions. Fuses are classified into two categories based on their operation: thermal fuse and electrical fuse. Thermal fuses can be cut by lasers and be linked by laser repair. An electrical fuse utilizes electro-migration for both forming open circuits and for repairing. The electrical fuse for semiconductor devices may be classified into categories of poly electrical fuse, MOS capacitor anti-fuse, diffusion fuse, contact electrical fuse, contact anti-fuse, and the like.

SUMMARY OF THE INVENTION

According to an embodiment of the present invention, a method for fabricating semiconductor device is disclosed. First, a substrate is provided, and first fuse branches and second fuse branches are formed in the substrate, in which the first fuse branches and the second fuse branches are separated by a shallow trench isolation (STI) and the second fuse branches include different sizes. Next, fuse elements are formed to connect the first fuse branches and the second fuse branches.

According to another embodiment of the present invention, a semiconductor device is disclosed. The semiconductor device includes: fuse elements that can be disconnected by irradiating a laser beam; first fuse branches connected to one side of the fuse elements; and second fuse branches connected to another side of the fuse elements, in which the second fuse branches comprise different sizes.

These and other objectives of the present invention will no doubt become obvious to those of ordinary skill in the art after reading the following detailed description of the preferred embodiment that is illustrated in the various figures and drawings.

2

Figure 4:
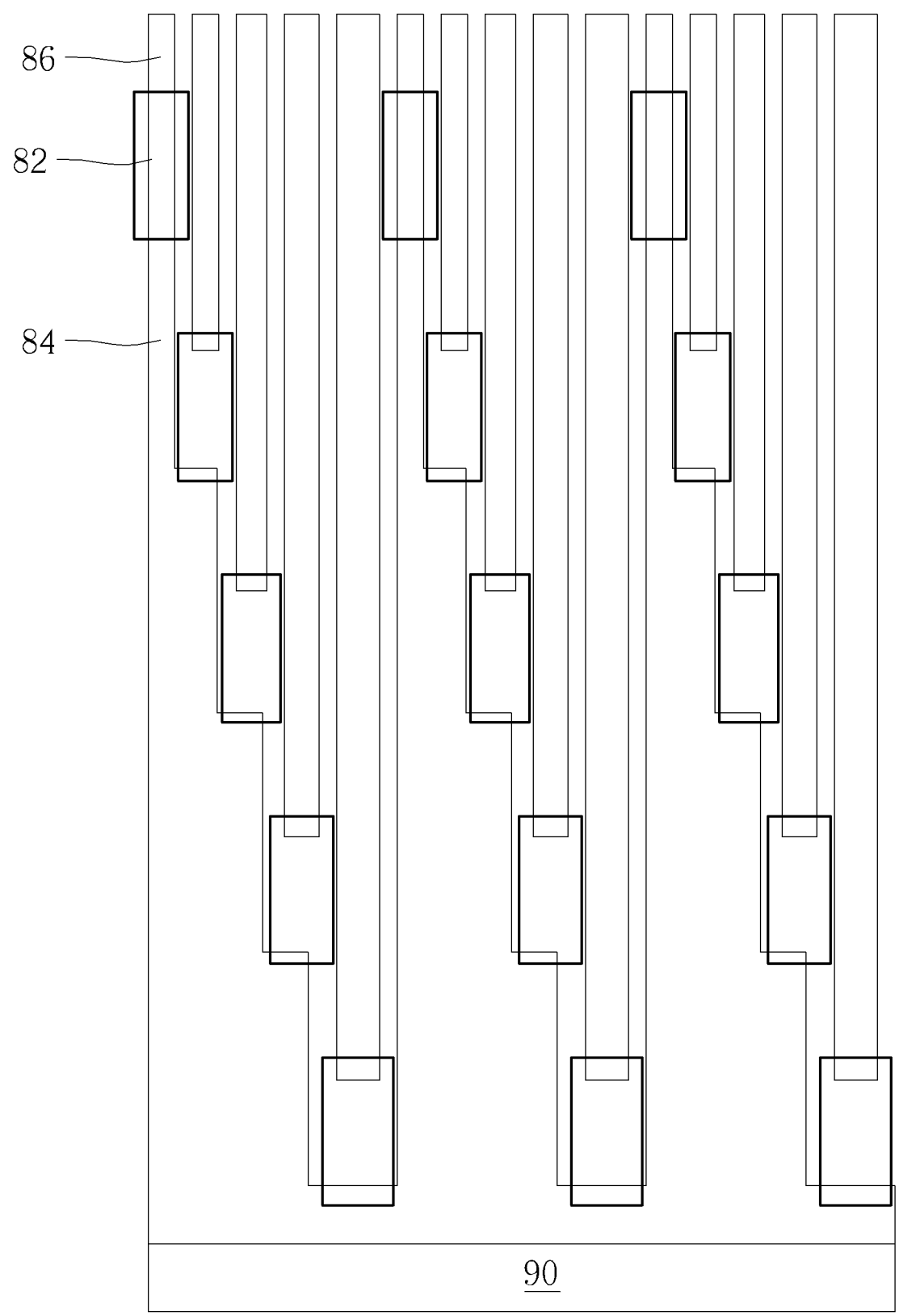

FIG. 4 illustrates a top view of an electric fuse structure according to an embodiment of the present invention.

DETAILED DESCRIPTION

Figure 1:
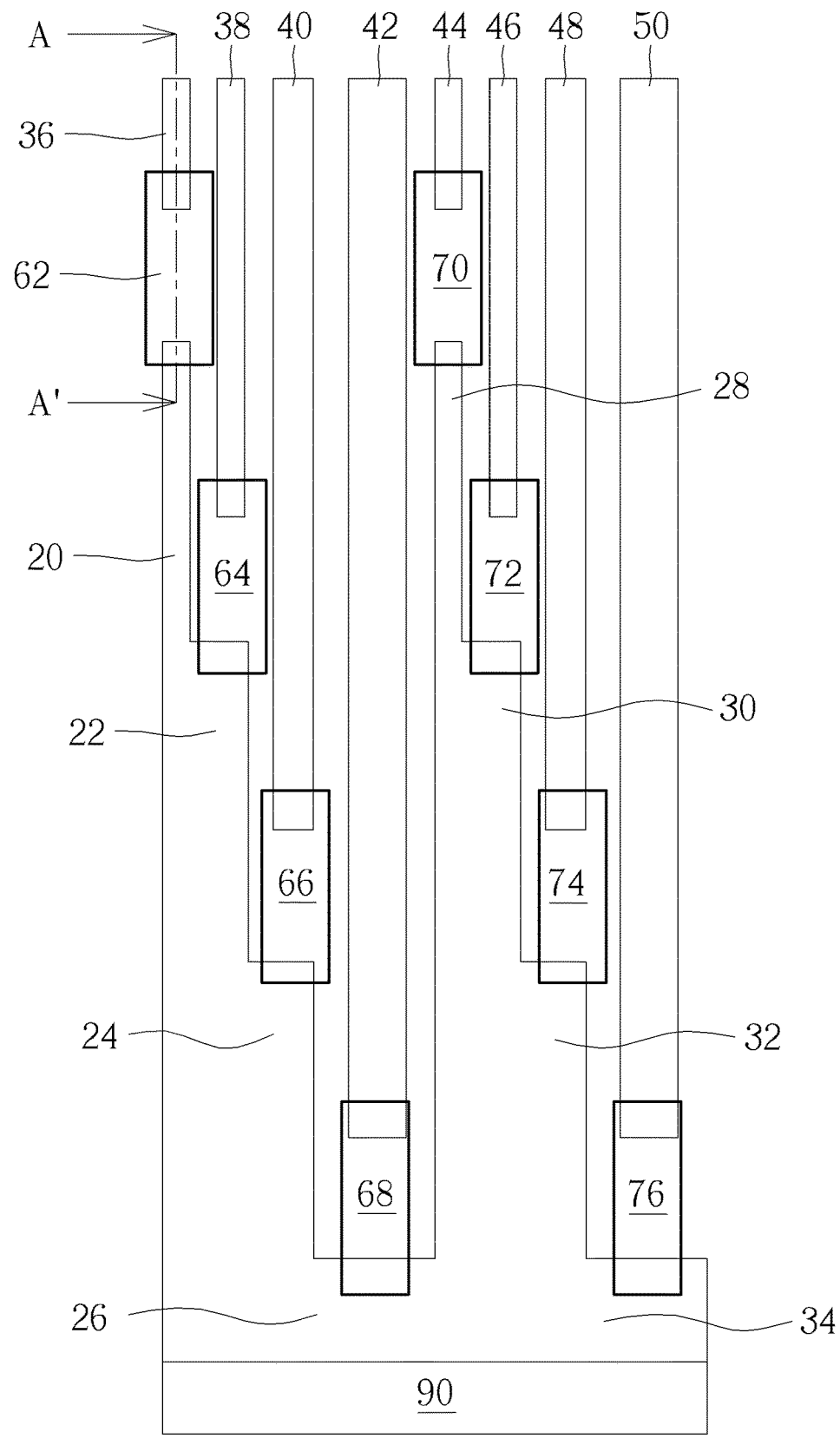
FIG. 1 illustrates a top view for fabricating an electric fuse structure according to a preferred embodiment of the present invention.
Figure 2:
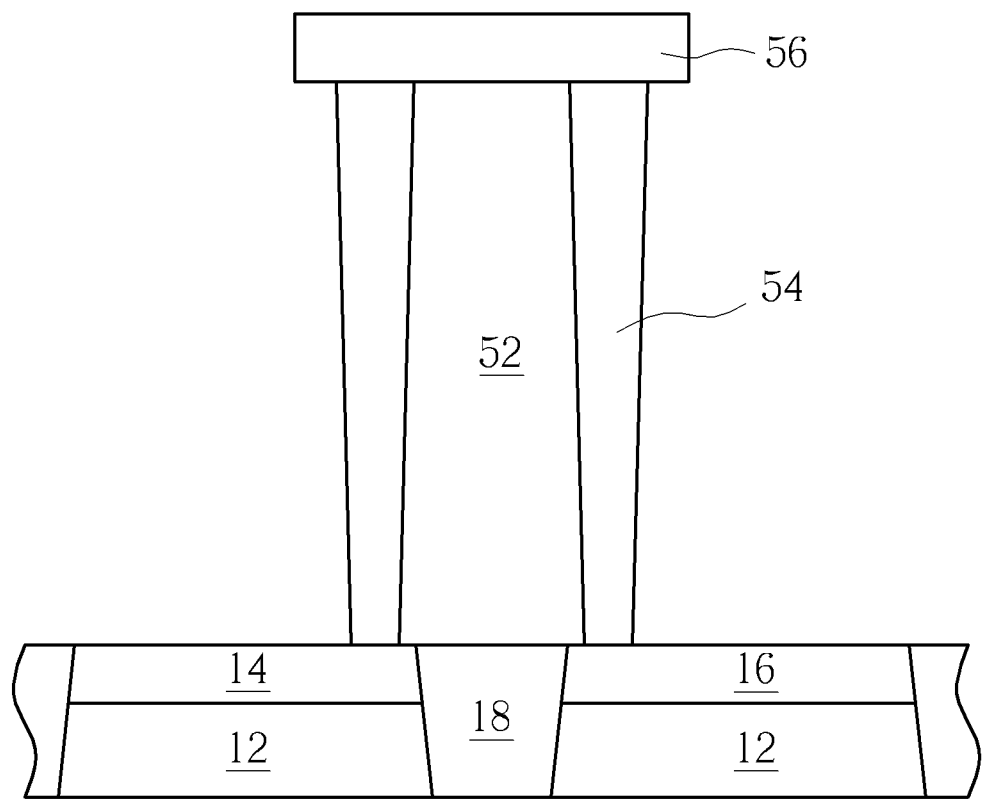
FIG. 2 illustrates a cross-sectional view of FIG. 1 along the sectional line AA'.

Referring to FIGS. 1-2, FIG. 1 illustrates a top view for fabricating an electric fuse structure according to a preferred embodiment of the present invention, and FIG. 2 illustrates a cross-sectional view of FIG. 1 along the sectional line AA'. As shown in FIGS. 1-2, a substrate 12 is provided, in which the substrate 12 could be a semiconductor substrate such as a silicon substrate, an epitaxial substrate, a SiC substrate, or a silicon-on-insulator (SOI) substrate, but not limited thereto. At least an active device such as a metal-oxide semiconductor (MOS) transistor could be formed on the substrate, in which the MOS transistor could include typical transistor elements such as gate structure, spacer, source/drain region, silicides, and epitaxial layers.

Next, doped region 14, 16, such as a source/drain region of the MOS transistor are formed in the substrate 12, in which the doped regions 14, 16 are separated by a shallow trench isolation (STI) 18. In this embodiment, the doped regions 14, 16 preferably constitute first fuse branches 20, 22, 24, 26, 28, 30, 32, 34 and second fuse branches 36, 38, 40, 42, 44, 46, 48, 50 of the electric fuse structure. It should be noted that in addition to using doped regions as fuse branches of the fuse structure, it would also be desirable to form gate patterns (such as gate structure of the MOS transistor) (not shown) made of polysilicon on the substrate 12 to serve as fuse branches of the electric fuse structure, which is also within the scope of the present invention.

Nest, an interlayer dielectric (ILD) layer 52 is formed on the substrate 12 to cover the MOS transistor, via conductors 54 are formed in the ILD layer 52 to connect to the doped regions 14, 16 within the substrate 12, and trench conductors 56 (only a single trench conductor is shown in FIG. 2) are formed on the ILD layer 52 to connect to the via conductors 54. Preferably, the trench conductors 56 electrically connected to the doped regions 14, 16 through via conductors 54 are serving as the fuse elements 62, 64, 66, 68, 70, 72, 74, 76 shown in FIG. 1.

In this embodiment, the formation of via conductors 54 and trench conductors 56 could be accomplished by a dual damascene process, in which each of the via conductors 54 and trench conductors 56 could at least include a barrier layer (not shown) and a metal layer (not shown). The barrier layer could be selected from the group consisting of Ti, TiN, Ta, and TaN and the metal layer could be selected from the group consisting of W, Cu, Al, TiAl, and CoWP. Since the fabrication of via conductors and trench conductors through dual damascene process is well known to those skilled in the art, the details of which are not explained herein for the sake of brevity.

Viewing from the top view perspective as illustrated in FIG. 1, the electric fuse structure preferably includes fuse elements 62, 64, 66, 68, 70, 72, 74, 76 that can be disconnected by irradiating a laser beam, first fuse branches 20, 22, 24, 26, 28, 30, 32, 34 connected to one side of the fuse elements 62, 64, 66, 68, 70, 72, 74, 76, and second fuse branches 36, 38, 40, 42, 44, 46, 48, 50 connected to another side of the fuse elements 62, 64, 66, 68, 70, 72, 74, 76.

In this embodiment, each of the fuse elements 62, 64, 66, 68, 70, 72, 74, 76 is preferably made of a conductive layer or the trench conductor 56 disclosed above, each of the first fuse branches 20, 22, 24, 26, 28, 30, 32, 34 and second fuse branches 36, 38, 40, 42, 44, 46, 48, 50 is made of the doped regions 14, 16, and the first branches 20, 22, 24, 26, 28, 30, 32, 34 and second fuse branches 36, 38, 40, 42, 44, 46, 48, 50 are connected to the fuse elements 62, 64, 66, 68, 70, 72, 74, 76 through the via conductors 54, 56 shown in FIG. 2.

Viewing from a more detailed perspective, even though the first fuse branches 20, 22, 24, 26, 28, 30, 32, 34 are made of a plurality of doped regions, the doped regions could be viewed as a single doped region as they are connecting and contacting to each other. The second fuse branches 36, 38, 40, 42, 44, 46, 48, 50 on the other hand include doped regions not contacting to each other. Preferably, the first fuse branches 20, 22, 24, 26, 28, 30, 32, 34 not only connect to the fuse elements 62, 64, 66, 68, 70, 72, 74, 76 but also connect to a common power supply 90.

In other words, the first fuse branches 20, 22, 24, 26, 28, 30, 32, 34 are interconnected and contacting each other while constituting a step-shaped doped region pattern altogether, in which the first fuse branches 20, 22, 24, 26, 28, 30, 32, 34 also include different lengths. In this embodiment, the lengths of the first fuse branches 20, 22, 24, 26, 28, 30, 32, 34 are preferably measured from the end contacting the fuse elements 62, 64, 66, 68, 70, 72, 74, 76 to the end contacting the common power supply 90. For instance, the length of the first fuse branch 20 is measured from the end contacting the fuse branch 62 to the end contacting the common power supply 90 and the length of the first fuse branch 22 is measured from the end contacting the fuse element 64 to the end contacting the common power supply 90, in which the length of the first fuse branch 20 being greater than the length of the first fuse branch 22. In contrast to the first fuse branches 20, 22, 24, 26, 28, 30, 32, 34, the second fuse branches 36, 38, 40, 42, 44, 46, 48, 50 include different sizes while not contacting each other.

Specifically, the definition of having different sizes in this embodiment refers to the fact that the second fuse branches 36, 38, 40, 42, 44, 46, 48, 50 share different widths and different lengths in correspondence to the widths and lengths of the first fuse branches 20, 22, 24, 26, 28, 30, 32, 34.

For instance, the fuse element 62 shown in FIG. 1 is connected to the longest first fuse branch 20 and the shortest second fuse branch 36, in which the first fuse branch 20 and the second fuse branch 36 could share equal widths. The first fuse branch 22 connected to the fuse element 64 is slightly shorter than the first fuse branch 20 on the left, whereas the second fuse branch 38 connected to the fuse element 64 is slightly longer than the adjacent second fuse branch 36, and the width of the second fuse branch 38 is preferably equal to the width of the second fuse branch 36. The first fuse branch 24 connected to the fuse element 66 is slightly shorter than the first fuse branch 22 on the left, whereas the second fuse branch 40 connected to the fuse element 66 is slightly longer than the adjacent second fuse branch 38, and the width of the second fuse branch 40 is also slightly greater than the width of the second fuse branch 38.

In general, when two ends of fuse elements were connected to fuse branches of different lengths at the same time, the resistance value measured between the fuse elements and the fuse branches would not be a fixed value if the widths of the fuse branches were also the same.

For instance, if the first fuse branch 20 and second fuse branch 36 connected to the fuse element 62 and the first fuse branch 24 and second fuse branch 40 connected to the fuse element 66 were to share equal widths, the resistance measured at the fuse element 66 would be greater than the resistance measured at the fuse element 62. Since unstable resistance value affects the operation and performance of fuse structure significantly, the present invention preferably adjusts the lengths and widths of the fuse branches connected to one end of the fuse elements, such as by pairing the longer first fuse branch 20 with the shorter and thinner second fuse branch 36 and pairing the shorter first fuse branch 24 with the longer and wider second fuse branch 40. By doing so, the resistance value of each electric fuse structure could be controlled under a same range.

In addition to using different widths of the second fuse branches for adjusting the resistance of the electric fuse structure, it would also be desirable to control the resistance value of the fuse structure within a certain range by having different concentrations for the doped regions constituting the second fuse branches, or using different gate thickness when the second fuse branches are made of polysilicon gates. For instance, when the second fuse branches are constituted by doped regions, it would be desirable to keep the widths and lengths of the second fuse branches the same while having different dopant concentrations for at least part of the second fuse branches, or have different widths and different dopant concentrations for at least part of the second fuse branches at the same time, which are all within the scope of the present invention. When the second fuse branches are constituted by polysilicon gates, it would be desirable to keep the widths, lengths, and thicknesses (or heights) of the polysilicon gates the same while part of the second fuse branches having doped regions of different concentrations, or provide different widths, lengths, and/or thicknesses for the polysilicon gates while part of the second fuse branches having doped regions of different concentrations, which are all within the scope of the present invention.

Preferably, the width of the second fuse branch 36 in this embodiment is between 0.41 μm to 0.5 μm or most preferably at 0.45 μm and the length of the second fuse branch 36 is between 3.42 μm to 4.27 μm or most preferably at 3.88 μm. The width of the second fuse branch 38 in this embodiment is between 0.41 μm to 0.5 μm or most preferably at 0.45 μm and the length of the second fuse branch 38 is between 6.24 μm to 7.63 μm or most preferably at 6.94 μm. The width of the second fuse branch 40 in this embodiment is between 0.48 μm to 0.58 μm or most preferably at 0.53 μm and the length of the second fuse branch 40 is between 9 μm to 11 μm or most preferably at 10 μm. The width of the second fuse branch 42 in this embodiment is between 0.59 μm to 0.72 μm or most preferably at 0.65 μm and the length of the second fuse branch 42 is between 11.75 μm to 14.37 μm or most preferably at 13.06 μm.

In addition, the distance between any two adjacent second fuse branches 36, 38, 40, 42, 44, 46, 48, 50, such as the distance between adjacent doped regions is preferably between 0.13 μm to 0.15 μm or most preferably at 0.14 μm. The distance between any two adjacent and/or parallel fuse elements 62, 64, 66, 68, 70, 72, 74, 76, such as the distance between fuse element 62 and fuse element 70 is preferably between 2.38 μm to 2.90 μm or most preferably at 2.64 μm.

Figure 3:
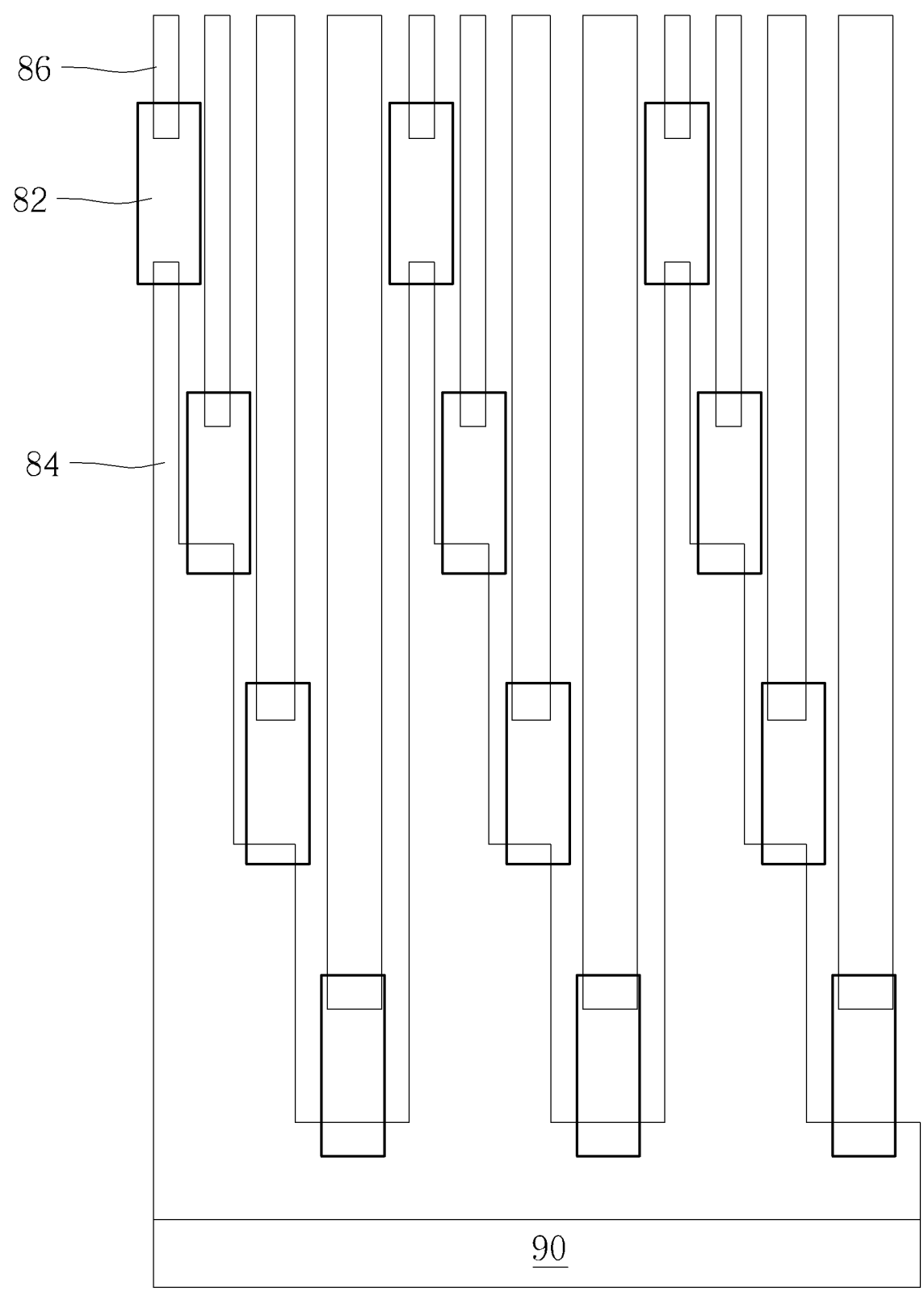
FIG. 3 illustrates a top view of an electric fuse structure according to an embodiment of the present invention.

Referring to FIG. 3, FIG. 3 illustrates a top view of an electric fuse structure according to an embodiment of the present invention. As shown in FIG. 3, the electric fuse structure preferably includes twelve fuse elements 82, in which each of the fuse elements 82 is connected to a first fuse branch 84 and a second fuse branch 86. For simplicity reason, only one number marking is assigned to each of the fuse elements 82, first fuse branches 84, and second fuse branches 86. Similar to the embodiment disclosed in FIG. 1, the first fuse branches 84 connected to the fuse elements 82 preferably share different lengths and contact each other. The second fuse branches 86 on the other hand share different lengths and different widths and at least part of the second fuse branches 86 are separated or not contacting adjacent second fuse branches.

Referring to FIG. 4, FIG. 4 illustrates a top view of an electric fuse structure according to an embodiment of the present invention. As shown in FIG. 4, the electric fuse structure preferably includes fifteen fuse elements 82, in which each of the fuse elements 82 is connected to a first fuse branch 84 and a second fuse branch 86. Similar to the embodiment disclosed in FIG. 1, the first fuse branches 84 connected to the fuse elements 82 preferably share different lengths and contact each other. The second fuse branches 86 on the other hand share different lengths and different widths and at least part of the second fuse branches 86 are separated or not contacting adjacent second fuse branches.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   fuse elements that can be disconnected by irradiating a laser beam;
   first fuse branches extending along a first direction and connected to one side of the fuse elements along a second direction orthogonal to the first direction, wherein the first fuse branches comprise different lengths along the first direction and different widths along the second direction and directly and physically contact each other laterally along the second direction and one end of the first fuse branches not connected to the fuse elements are aligned along the second direction; and
   second fuse branches extending along the first direction and directly connected to another side of the fuse elements, wherein the second fuse branches comprise different lengths along the first direction and different widths along the second direction, the fuse elements are wider than the second fuse branches under top view along the second direction, and the first direction is an extending direction of the first fuse branches, the second fuse branches, and the fuse elements, respectively.

2. The semiconductor device of claim 1, wherein the first fuse branches comprise a single diffusion region.

3. The semiconductor device of claim 1, wherein the second fuse branches comprise diffusion regions not contacting each other.

4. The semiconductor device of claim 1, wherein the fuse elements comprise conductive layers.

5. The semiconductor device of claim 4, wherein the conductive layers comprise copper.

6. The semiconductor device of claim 1, wherein the second fuse branches not contacting each other.

7. The semiconductor device of claim 1, wherein a bottom surface of the fuse elements is elevated above a top surface of the second fuse branches, and a shallow trench isolation disposed directly under the fuse elements.

* * * * *